Aug. 4, 1970 | KOJI KODAMA | 3,522,446

CURRENT SWITCHING LOGIC CIRCUIT

Filed Aug. 28, 1968 | 4 Sheets-Sheet 1

Koji Kodama
INVENTOR.

BY George B. Oujevolk
Attorney

Aug. 4, 1970 | KOJI KODAMA | 3,522,446

CURRENT SWITCHING LOGIC CIRCUIT

Filed Aug. 28, 1968 | 4 Sheets-Sheet 2

Koji Kodama

INVENTOR.

BY George B. Oujevolk

Attorney

Aug. 4, 1970 KOJI KODAMA 3,522,446

CURRENT SWITCHING LOGIC CIRCUIT

Filed Aug. 28, 1968 4 Sheets-Sheet 3

Koji Kodama

INVENTOR.

BY George B. Oujevolk

Attorney

Koji Kodama
INVENTOR.

BY George B. Oujevolk
Attorney

United States Patent Office 3,522,446
Patented Aug. 4, 1970

3,522,446
CURRENT SWITCHING LOGIC CIRCUIT
Koji Kodama, Tokyo, Japan, assignor to Tokyo Shibaura Electric Co., Ltd., Kawasaki-shi, Japan, a corporation of Japan
Filed Aug. 28, 1968, Ser. No. 755,967
Claims priority, application Japan, Aug. 31, 1967, 42/55,499
Int. Cl. H03k *19/36*
U.S. Cl. 307—215 10 Claims

ABSTRACT OF THE DISCLOSURE

A current switching logic circuit comprising a constant current source consisting of transistors for converting a common emitter current to a constant current, a voltage comparator containing a first transistor connected to the constant current source and supplied with input signals and a second transistor supplied with a threshold level and a bias circuit composed of a group of elements having the same characteristics as those involved in the logic circuit and supplying a bias voltage to the constant current source and the voltage comparator characterized in that the subject logic circuit is provided with a means for impressing the constant current source with a first bias voltage of $V_{EE}+2V_{BE}$ obtained from the bias circuits and also a means for supplying the voltage comparator with a second bias voltage of $-3/2V_{BE}$ or $-5/2V_{BE}$ obtained from the bias circuits.

The present invention relates to a stable current switching logic circuit, and more particularly to a logic circuit characterized in that it is provided with a bias circuit to eliminate dependency on the power supply voltage of a logic level, it can be converted to a semiconductor integrated circuit with great ease and is also well adapted for use in an electronic computer.

There have been proposed a large variety of logic circuits for an electronic computer. Among them, a current switching logic circuit has attracted much attention as a type available for use in high speed logic operation. With this current switching logic circuit, there is performed logic operation by switching from a transistor having a predetermined threshold level to a transistor responding to a binary input signal composed of the digits "1" and "0," so that the speed of such response becomes extremely rapid.

As a result of the recent development of integrated circuits, there has been increasing demands for use in an electronic computer a logic circuit of more compact size and yet operable at a far greater speed. In this connection, there is disclosed in the United States Pat. No. 3,259,761 a current switching logic circuit converted to an integrated type. This patent describes a method for reducing power consumption and compensating for variations in temperature and power supply voltage which will pose problems in converting the logic circuit to an integrated type.

However, since unfailing compensation for variations in power supply voltage and temperature is directly associated with reliable logic operation, control of these variations will assume extremely great importance. This means that if logic operation could be carried out independently of power supply voltage and temperature then it would be possible to use an integrated circuit converted from a logic circuit with a much higher reliability in an electronic computer.

On the other hand, where transistors or resistors are positioned on a chip in converting a logic circuit to an integrated type there are various design conditions which have to be taken into account. However, if a logic circuit is prepared, for example, using transistors of equal type as functional elements, its conversion to an integrated circuit can be designed with remarkable ease. While it is difficult to demand for such a high precision fabrication of individual resistors involved in an integrated circuit as will assure perfect agreement among the absolute resistance values thereof, it may be possible to expect an appreciable degree of relative precision with respect to said agreement. In other words, for the same value of resistance given, it is only necessary to dispose resistors of the same shape and size on the same chip.

It is accordingly an object of the present invention to provide a current switching logic circuit well adapted for use in a semiconductor integrated circuit which is capable of reliably compensating for variations in power supply voltage and temperature.

Another object of the invention is to assure a reliable logic operation by setting up a threshold level which is always stable to variations in power supply voltage and temperature.

Another object of the invention is to compensate for fluctuations in the logic level by forming a logic circuit and bias circuit respectively from a plurality of functional elements having the same electric characteristics thereby to allow a logic circuit to be easily converted to an integrated type.

Still another object of the invention is to carry out remarkable improvements in the noise margin so as to assure an unfailing logic operation against input noises.

A further object of the invention is to reduce output level deviation by allowing a common emitter current to have a constant form thereby to realize the easy conversion of a logic circuit to an integrated type.

A characteristic of the invention is that circuit elements very favourable for conversion of a logic circuit to an integrated type consist of transistor and resistors.

Another characteristic of the invention is that a transistor involved in a voltage comparator is furnished with a threshold level operable independently of variations in power supply voltage and temperature and that a transistor used in a constant current source is impressed with a bias voltage capable of compensating for temperature variations.

Still another characteristic of the invention is that a bias circuit to provide a bias voltage for both threshold level and a constant current source is formed from elements having the same characteristics as those of a logic circuit.

These and other objects, effects and features of the present invention will be apparent from the following description given by reference to the appended drawings, in which.

Figures 1, 2:
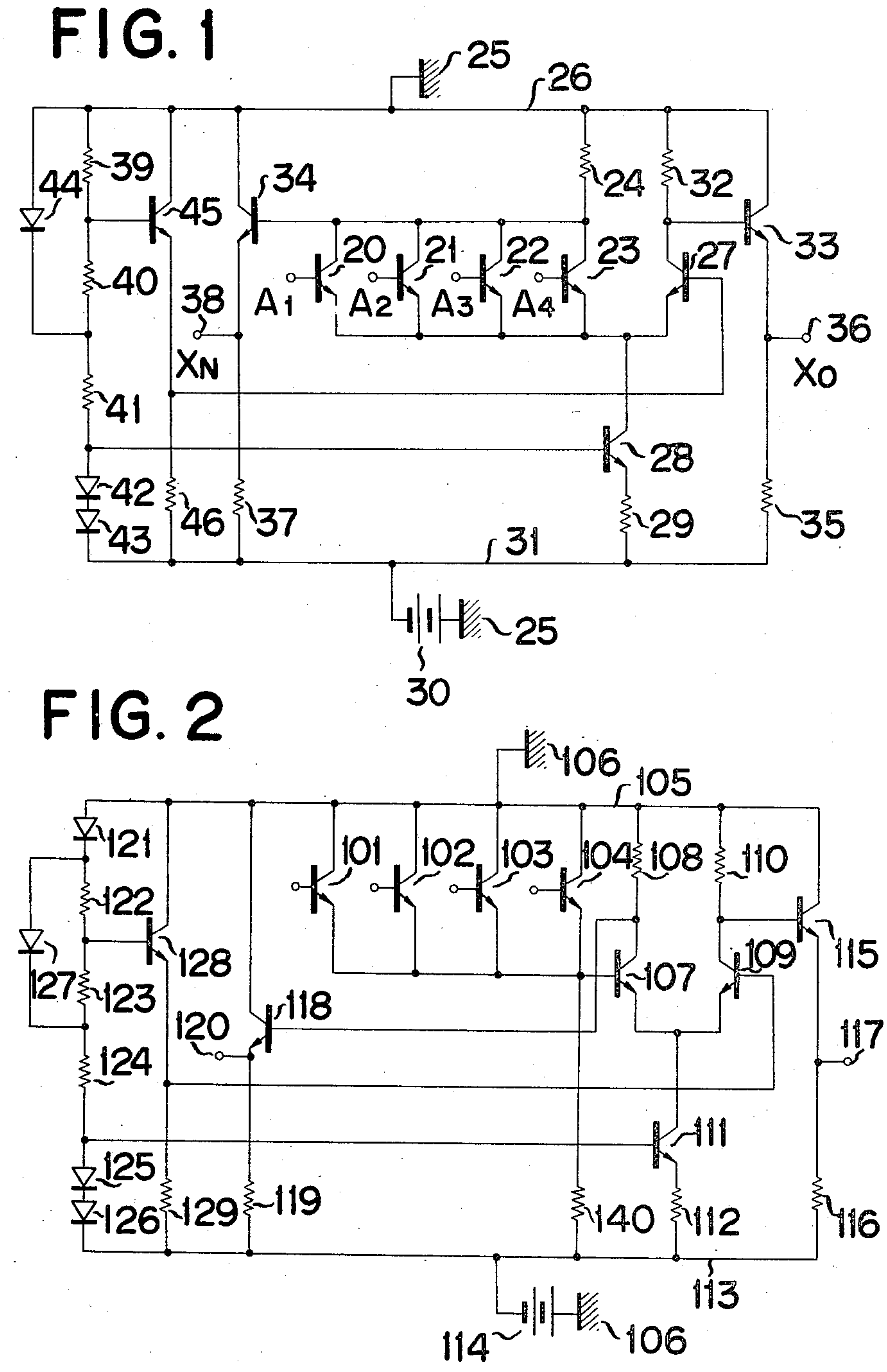
FIG. 1 is a diagram of a current switching logic circuit converted to an integrated type according to an embodiment of the present invention.
FIG. 2 is a diagram of a current switching logic circuit according to another embodiment of the invention, where the input gate consists of an emitter follower.
Figure 3:
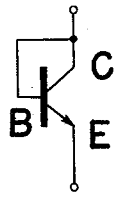
Figure 4A:
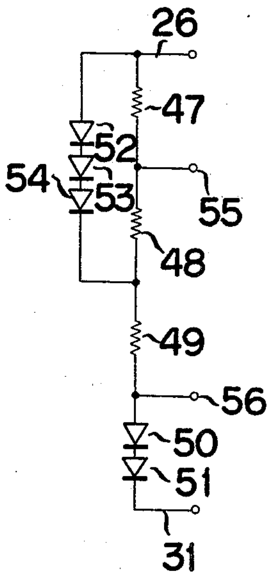
Figure 4B:
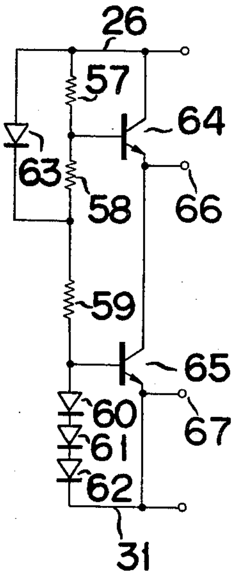
Figure 4C:
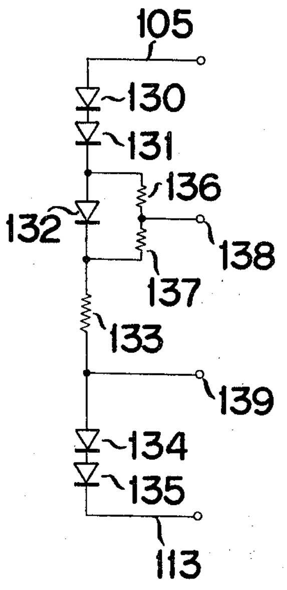
Figure 5:
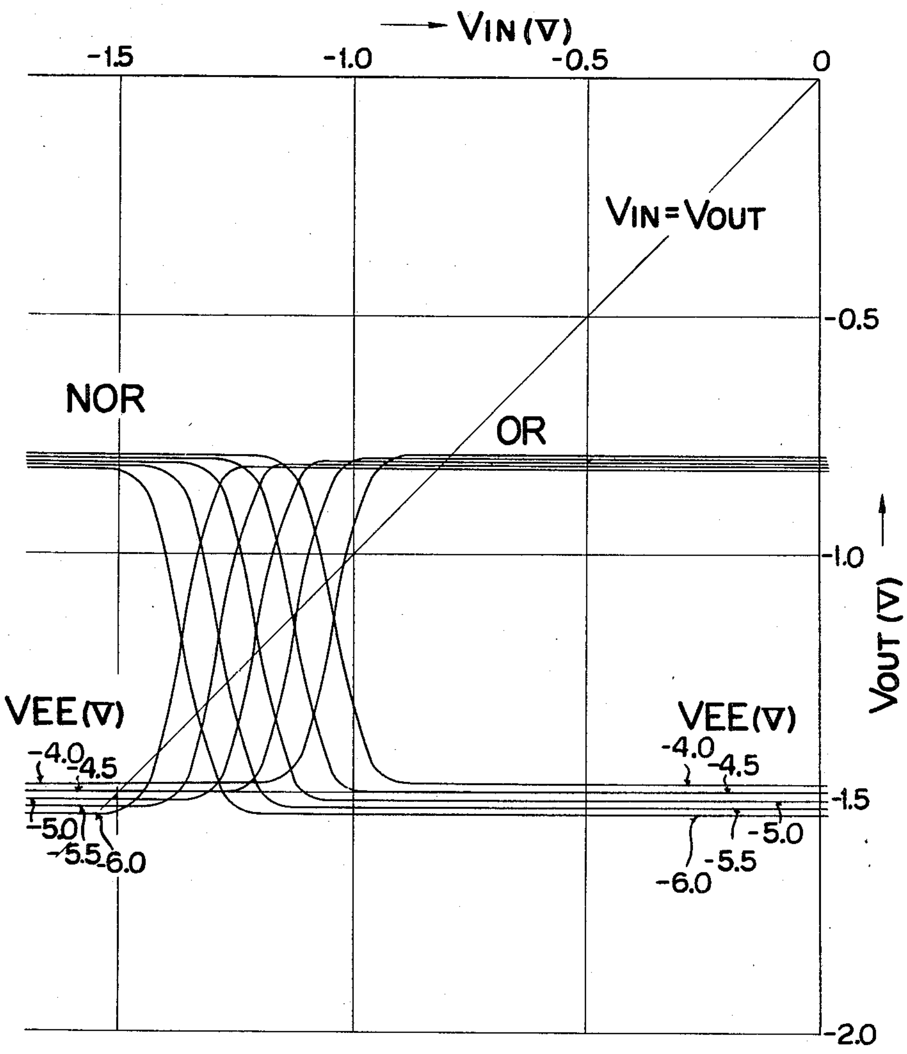
Figure 6:
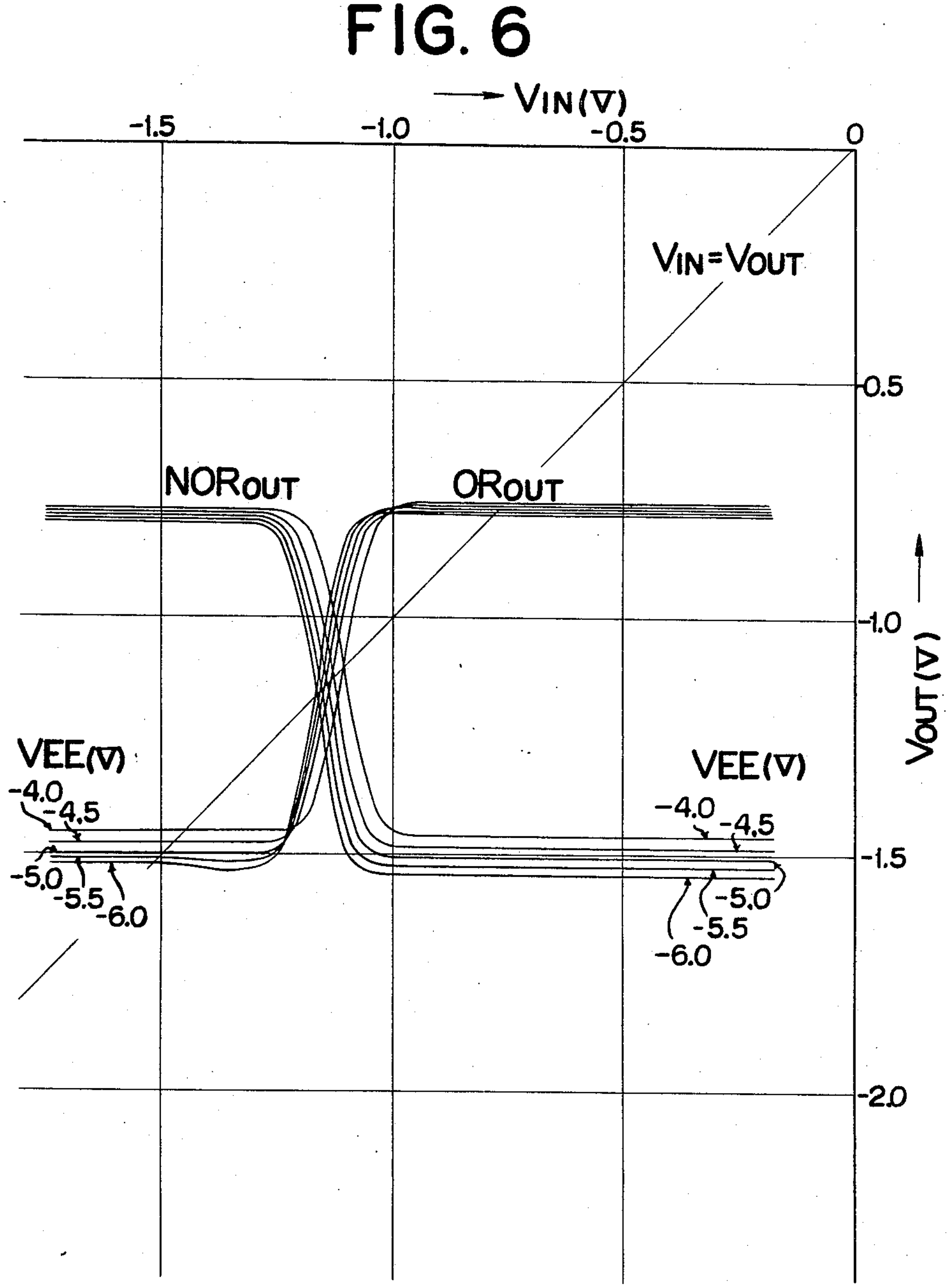

FIG. 3 schematically shows the construction of a diode used in the invention;

FIGS. 4*a*, 4*b* and 4*c*, respectively, indicate the construction of a bias circuit, *a* and *b* representing bias circuits associated with FIG. 1 and *c* a bias circuit related to FIG. 2;

FIG. 5 diagrammatically presents the voltage transferring characteristic when the conventional bias circuit is used, showing remarkable fluctuations in the threshold level as against variations in the power supply voltage; and FIG. 6 is a schematic representation of the characteristics of inputs and outputs associated with the logic circuit of the present invention shown in FIG. 2, disclosing that the threshold level exhibits substantially no fluctuations as against variations in the power supply voltage.

FIG. 1 presents the construction of the current switching logic circuit of the present invention converted to an integrated type. The input gate comprises transistors 20, 21, 22 and 23, and the collector and emitter electrodes of each of these transistors are connected in common. The collector electrodes are connected in common through a resistor 24 to a conductor 26 contacting a ground potential 25. The emitter electrode of a transistor 27 used as a voltage comparator, namely, intended to compare its own voltage with that of the aforesaid transistors 20, 21, 22 and 23 as a group, and having its base electrode furnished with a threshold level is connected to the collector electrode of a transistor 28 in common with the emitter electrodes of those transistors 20, 21, 22 and 23. Again the emitter electrode of the transistor 28 is connected through a resistor 29 to a conductor 31 contacting a negative D.C. voltage supply 30. The positive side of the negative D.C. voltage supply 30 is grounded by a ground potential 25. The collector electrode of the transistor 27 acting as a voltage comparator is connected through a resistor 32 to a conductor 26.

On the other hand, an output emitter follower for coordinating the voltage level of inputs and that of outputs is formed of transistors 33 and 34. The base electrode of the transistor 33 is connected to the collector electrode of the transistor 27. The collector electrode of the transistor 33 is connected to the conductor 26 and its emitter electrode is connected through a resistor 35 to a conductor 31, obtaining an output 36 from the emitter electrode of the transistor 33. The base electrode of the transistor 34 is connected in common to be collector electrodes of the aforementioned transistors 20, 21, 22 and 23. The collector electrode of the transistor 34 is connected to the conductor 26 and its emitter electrode is connected through a resistor 37 to the conductor 31, obtaining an output 38 from the emitter electrode of the transistor 34.

There will now be described the switching operation of the current switching logic circuit constructed in the aforesaid manner. Let it be assumed that the base electrodes of the transistors 20, 21, 22 and 23 constituting an input gate are supplied with inputs $A_1$, $A_2$, $A_3$ and $A_4$, respectively, the base electrode of the transistor 27 is a bias voltage having a threshold level and the transistor 27 is turned on as an initial condition. When at least one of the inputs $A_1$, $A_2$, $A_3$ and $A_4$ reaches a "high" level, the transistor 27 is turned off and the common emitter current which has flowed through the resistors 32 and 29 is so changed as to run through the resistors 24 and 29 in the order mentioned. Speaking of the output, when the transistor 27 is kept "on," the output 36 will be reduced to a "low" level, and conversely the output 38 will be raised to a "high" level, because there occurs no voltage drop in the resistor 24. On the other hand, when the transistor 27 is turned off the resistor 32 will be relieved of a voltage drop, so that the output 36 will be raised to a "high" level, whereas the output 38 will reduce to a "low" level.

Accordingly, the aforementioned operations may be expressed by the following equations of logic:

With output 36 represented by $X_0$,

OR operation: $X_0=A_1+A_2+A_3+A_4$

With output 38 represented by $X_N$,

NOR operation: $X_N=\overline{A_1+A_2+A_3+A_4}=\overline{X_0}$

There will now be described the bias circuit which supplies a threshold level to the base electrode of the transistor 27 used as a voltage comparator and a bias voltage to the base electrode of the transistor 28 forming a constant current source. A power supply voltage across the conductors 26 and 31 is shared by serially connected resistors 39, 40 and 41 and diodes 42 and 43. A diode 44 is connected parallel to the resistors 39 and 40 and the node of the resistors 39 and 40 is connected to the base electrode of a transistor 45. The collector electrode of the transistor 45 is connected to the conductor 26 and the emitter electrode thereof is connected through a resistor 46 to the conductor 31 to form an emitter follower. The emitter electrode of the transistor 45 is connected to the base electrode of the transistor 27 used as a voltage comparator so as to supply said base electrode with a bias voltage having a threshold level. And the node of the resistor 41 and diode 42 is connected to the base electrode of the transistor 28 forming a constant current source so as to supply said base electrode with a bias voltage.

The aforementioned diodes 42, 43 and 44 are respectively prepared by connecting in common the base and collector electrodes of transistors having the same properties as those used in the present invention as shown in FIG. 3. The normal voltage impressed across the base and emitter electrodes of the transistors used herein is denoted by $V_{BE}$. Now, let it be assumed that the resistors 39 and 40 have the same value of resistance, these resistors arranged in parallel have a sufficient amount of resistance as compared with the operating resistance of the diode 44, so that the operating resistance of this diode is negligible. Accordingly, the base electrode of the transistor 45 is supplied with a potential of $-1/2V_{BE}$, and the threshold level obtained at the emitter electrode of the transistor 45 is $-3/2V_{BE}$. On the other hand, with a negative D.C. voltage supply 30 represented by $V_{EE}$, the voltage level of the diodes 42 and 43 amounts to $V_{EE}+2V_{BE}$. This potential is impressed as a bias voltage on the base electrode of the transistor 28. Thus, the voltage supplied to the resistor 29 amounts to $V_{BE}$, so that the common emitter current flowing through the resistor 29 is independent of variations in the power supply voltage. Namely, the current passing through the resistor 24 or 32 and performing a switching operation will become equivalent to the common emitter current if a sufficiently large amplification $\beta$ is allowed for the transistor used in the present invention, so that the output will not be affected by variations in the power supply voltage. Furthermore, fluctuations, if any, in the transistor 28 resulting from temperature variations will be compensated for by the diodes 42 and 43.

As described above, the threshold level supplied to the base electrode of the transistor 27 has a voltage of $-3/2V_{BE}$. On the other hand, if the voltage levels corresponding to the logic inputs "0" and "1" are set at $-2V_{BE}$ and $-V_{BE}$, then these voltage levels will be kept independent of variations in the power supply voltage. Further referring to the temperature variations, fluctuations in the diode 44 and transistor 45 are matched by those in the transistor 27, so that it is possible to compensate for fluctuations in the threshold level. Namely, if the voltages of logic input signals are set at $-V_{BE}$ and $-2_{BE}$, and the logic swing at $V_{BE}$ thereby to allow the threshold level to stand at a substantially halfway point and bias circuits formed of transistors having the same characteristics as those constituting the logic circuit, then reliable compensation for variations in power supply voltage and temperature will be assured by obtaining a threshold voltage of $-3/2V_{BE}$.

The voltage level presented by the output 36 is equal to a sum arrived at by adding a voltage drop of $-V_{BE}$ by the transistor 33 to a voltage drop by the resistor 32. And the voltage level displayed by the output 38 is equal to a sum arrived at by adding a voltage drop of $-V_{BE}$ by the transistor 34 to a voltage drop by the resistor 24.

Therefore, if the logic "0" levels of the outputs 36 and 38 are represented by $V_O$ and $V_N$ respectively, the common emitter current by $I_{RO}$, the resistance values of the resistors 29, 24 and 32 by $R_O$, $R_1$ and $R_2$ respectively, the base potential of the transistor 28 by $V_{r2}$, the base emitter voltage by $V_{BE}$, the voltage on the both ends of the resistor 29 by $V_{RO}$, and the potential on line 31 by $V_{EE}$, then there will be established the following equations, provided that $I_{RO} \gg I_{CEO}$, $I_B$ wherein $I_{CEO}$ is a cut off current of the transistor 28, and $I_B$ is a base current when the transistor 28 is on.

$$V_O=-I_{RO}\cdot R_2-V_{BE}=-\frac{V_{RO}}{R_O}\cdot R_2-V_{BE}$$

$$V_N=-I_{RO}\cdot R_1-V_{BE}=-\frac{V_{RO}}{R_O}\cdot R_1-V_{BE}$$

Herein, $V_{r2}=V_{EE}+2V_{BE}$, and the following equation will be established:

$$V_{RO}=V_{r2}-V_{BE}-V_{EE}=V_{EE}+2V_{BE}-V_{BE}-V_{EE}=V_{BE}$$

Consequently, it follows:

$$V_O=-\frac{V_{RO}}{R_O}\cdot R_2-V_{BE}=\frac{R_2}{R_O}V_{BE}-V_{BE}$$

$$V_N=-\frac{V_{RO}}{R_O}\cdot R_1-V_{BE}=\frac{R_1}{R_O}V_{BE}-V_{BE}$$

Consequently, to make the logic "0" level of the output equal to the logic "0" level ($-2V_{BE}$) of the input, there should be established the equation $$V_O=V_N=-2V_{BE}$$

Namely, the establishment of an equation $R_O=R_1=R_2$ will be required to meet the above condition. This is extremely favourable for a semiconductor integrated circuit. In other words, it may be generalized that as viewed from the customary fabrication of individual resistors involved in an integrated circuit, precision in connection with agreement among the absolute resistance values these resistors is not fully satisfactory, but it is possible appreciably to improve the relative precision and that as the ratios of the absolute resistance values of the respective resistors approach 1, it will be easier to fabricate an integrated circuit. Namely, to obtain a semiconductor integrated circuit which will carry out reliable compensation for variation in temperature and power supply voltage, it is only required to mount resistors of the same shape and size on the same chip, provided they have the same resistance values.

A bias circuit may be constructed according to other embodiments of the invention as shown in FIGS. 4*a* and 4*b*. In FIG. 4*a*, the power supply voltage supplied across the conductors 26 and 31 is shared by serially connected resistors 47, 48 and 49 and diodes 50 and 51. Further, diodes 52, 53 and 54 are connected parallel to the resistors 47 and 48 which are allowed to have the same resistance value, thereby to obtain a threshold level of $-3/2V_{BE}$ from a node 55 of these resistors. There is also obtained from a node 56 of the resistor 49 and diode 50 a bias voltage of $V_{EE}+2V_{BE}$ for a constant current source.

FIG. 4*b* is a different type of bias circuit from that of *a*. In this case, the power supply voltage impressed across the conductors 26 and 31 is shared by serially connected resistors 57, 58 and 59 and diodes 60, 61 and 62. And parallel to the resistors 57 and 58 is connected a diode 63. The node of the resistors 57 and 58 is connected to the base electrode of a transistor 64. The collector electrode of the transistor 64 is connected to the conductor 26 and the emitter electrode thereof is connected to the collector electrode of a transistor 65. The base electrode of the transistor 65 is connected to the node of the resistor 59 and diode 60 and the emitter electrode thereof is connected to the conductor 31. From the emitter electrode of the transistor 64 is impressed a threshold level of $-3/2V_{BE}$ on a terminal 66, and from the emitter electrode of the transistor 65 is impressed a bias voltage of $V_{EE}+2V_{BE}$ to a terminal 67 so as to supply a bias voltage to the constant current source. In this case, the voltage of one of the diodes 60, 61 and 62 and the voltage $V_{BE}$ of the transistor 65 are offset by each other.

As described above, the diodes involved in a bias circuit consist of those having the same characteristics as the transistors of FIG. 3 included in a logic circuit. Further, the present invention uses transistors having the same characteristics, so that where a bias voltage is supplied by such transistors and diodes, the threshold level will have a voltage of $-3/2V_{BE}$ and the constant current source will have a bias voltage of $V_{EE}+2V_{BE}$. Consequently, the operation of the logic circuit of the present invention is not affected any way by variations in the power supply voltage and moreover, the elements involved therein mutually compensate for temperature variations because they have the same characteristics.

FIG. 2 is a diagram of a current switching logic circuit according to another embodiment of the present invention. The difference between this circuit and that of FIG. 1 is that in the former, the transistors involved in the input gate consist of emitter followers, and that the threshold level is shifted accordingly.

The input gate comprises transistors 101, 102, 103 and 104. The collector electrodes of these transistors are connected to a conductor 105, which in turn is grounded by a ground potential 106. The emitter electrodes of the transistors 101, 102, 103 and 104 are connected in common to the base electrode of a transistor 107 and emitter resistor is connected to the conductor 113 through resistor 140. The collector electrode of the transistor 107 is connected through a resistor 108 to a conductor 105. The base electrode of a transistor 109 which carries out a switching operation in cooperation with the transistor 107 is supplied with a threshold level, the collector electrode of the transistor 109 is connected through a resistor 110 to the conductor 105, and the emitter electrode thereof is connected to the collector electrode of a transistor 111 in common with the emitter electrode of the transistor 107. The emitter electrode of the transistor 111 is connected through a resistor 112 to a conductor 113. The transistor 111 is intended to form a constant current-source whereby the common emitter current running through the resistor 112 is converted to a constant one. The conductor 113 is connected to a negative D.C. voltage supply 114, the positive side of which is grounded by the ground potential 106.

On the other hand, the collector electrode of the transistor 109 is connected to the base electrode of a transistor 115 forming an emitter follower. The collector electrode of the transistor 115 is connected to the conductor 105 and the emitter electrode thereof is connected through a resistor 116 to the conductor 113, producing an output 117 from the emitter electrode of the transistor 115. Further, the collector electrode of the transistor 107 is connected to the base electrode of a transistor 118 forming an emitter follower. The collector electrode of the transistor 118 is connected to the conductor 105, and the emitter electrode thereof is connected through a resistor 119 to the conductor 113, producing an output 120 from the emitter electrode of the transistor 118.

The base electrodes of the input gate transistors 101, 102, 103 and 104 are supplied with input signals having voltages of $-2V_{BE}$ and $-V_{BE}$ corresponding to the logic level "0" and "1" respectively which have a logic swing of $V_{BE}$. The transistors 107 and 109 are caused to carry out a switching operation. In this case the input gate transistors 101, 102, 103 and 104 respectively constitute an emitter follower, so that there is required a threshold level which has been shifted by the amount of $V_{BE}$. Namely, the base electrode of the transistor 109 is supplied with a bias voltage of $-5/2V_{BE}$.

The bias voltage is obtained when the power supply voltage impressed across the conductors 105 and 113 is shared by the serially connected diode 121 and resistors 123, 124 and 125 as well as by diodes 126 and 127. In contrast to the circuit of FIG. 1, the diode 121 carries out compensation corresponding to the level shift of the input gate emitter followers. Also parallel to the resistors 122 and 123 is connected the diode 127, and the node of the resistors 122 and 123 is connected to the base electrode of a transistor 128. The collector electrode of the transistor 128 is connected to the conductor 105 and the emitter electrode thereof is connected through a resistor 129 to the conductor 113.

If the resistors 122 and 123 have the same resistance value which is fully larger than that of the diodes, then the emitter electrode of the transistor 128 will eventually be supplied with a bias voltage of $-5/2V_{BE}$. The connection of the emitter electrode of the transistor 128 to the base electrode of the transistor 109 enables a bias voltage of $-5/2V_{BE}$ to be supplied as a threshold level. The node of the diode 125 and resistor 124 is connected to the base electrode of the transistor 111, supplying the constant current source with a bias voltage of $V_{EE}+2V_{BE}$. Accordingly, like the circuit of FIG. 1, the arrangement of FIG. 2 allows a logic operation to be performed independently of variations in the power supply voltage and temperature.

The circuit of FIG. 2 wherein the input gate comprises emitter followers enables quicker responses to be made to inputs. Namely, when a logic circuit is converted to an integrated circuit, the collector electrodes of the elements involved are directly grounded, so that the collector capacity across the collector electrodes of the input gate transistors and the ground potential does not affect the operation of inputs as is the case with the circuit of FIG. 1. The reason is that in the case of FIG. 1, time delays take place depending on the amounts of capacity across the collector substrates, where as in the case of FIG. 2, connection of the collector electrodes of transistors 101, 102, 103 and 104 to the ground potential relieves the collector area restriction and enables the collector area of transistor 107 as small as that of transistor 109, and consequently the time constant to be remarkably reduced.

The bias circuit of FIG. 4*c* is another embodiment of the one shown in FIG. 2. The power supply voltage supplied across the conductors 105 and 113 is shared by diodes 130, 131 and 132, a resistor 133 and diodes 134 and 135, all connected in series. And resistors 136 and 137 are connected parallel to the diode 132. The parallel resistors 136 and 137 have the same resistance value which is fully larger than that of the diode 132. The node 138 of the resistors 136 and 137 is supplied with a threshold level of $-5/2V_{BE}$, and the node of the diode 134 and the resistor 133 is supplied with a bias voltage of $V_{EE}+2V_{BE}$.

FIG. 5 presents the responses made by output signals to input signals when the diode 127 is removed from the circut of FIG. 2. Namely, the figure shows changes in the threshold level when the power supply voltage of $V_{EE}$ is varied from —4 v. to —6 v. as against OR and NOR outputs. As seen from the figure, the threshold level changes to an extent of about 0.32 v. It is also observed that the threshold level appreciably changes as against the $V_{in}=V_{out}$ line where the level of the input $V_{in}$ is equal to that of the output $V_{out}$.

FIG. 6 indicates the responses made by outputs to the inputs of the current switching logic circuit of FIG. 2. As in FIG. 5, the power supply voltage of $V_{EE}$ is varied from —4 v. to —6 v. as against OR and NOR outputs. This arrangement reduces changes in the threshold level to about 0.07 v. making such changes substantially negligible relative to the $V_{in}=V_{out}$ line, and so noticeably improving the noise margin.

What is claimed is:

1. A current switching logic circuit formed in a semiconductor integrated circuit and responding to input signals having a first and second voltage level corresponding to a threshold level comprising a first and second transistor each having a collector, base and emitter electrode;

a means for supplying power supply voltage across a first grounded conductor and a second conductor connected to a negative D.C. voltage supply; a first resistor means connected between the collector electrode of the first transistor and the first conductor and supplying a voltage to said collector electrode; a second resistor means connected to the collector electrode of the second transistor and supplying a voltage to said collector electrode; a constant current source consisting of a third transistor and a third resistor connected in series across the emitter electrodes of the first and second transistors and the second conductor; an output circuit containing a fourth and fifth transistor forming an emitter follower circuit to obtain output signals from the collector electrodes of the first and second transistors, the base electrode of the fourth transistor being connected to the collector electrode of the first transistor, the collector electrode of said fourth transistor being connected to the first conductor and the emitter electrode of said fourth transistor being connected through a fourth resistor to the second conductor, and the base electrode of the fifth transistor being connected to the collector electrode of the second transistor, the collector electrode of said fifth transistor being connected to the first conductor and the emitter electrode of said fifth transistor being connected through a fifth resistor to the second conductor; a bias circuit supplying a threshold level of $-3/2V_{BE}$ or $-5/2V_{BE}$ to the base electrode of the first transistor and a bias voltage of $V_{EE}+2V_{BE}$ to the base electrode of the third transistor involved in the constant current source, the term $V_{BE}$ used herein representing the normal voltage across the base and emitter electrodes of the transistors used in the present invention and the term $V_{EE}$ denoting a negative D.C. voltage supplied to the second conductor; an input circuit supplying the base electrode of the second transistor with a binary input signal having two voltage levels, namely, $-V_{BE}$ as a first input signal and $-2V_{BE}$ as a second input signal; and an output circuit responding to the binary input signal and turning on either the first or second transistor thereby to issue a first and second output from the emitter electrodes of the fourth and fifth transistors respectively.

2. A current switching logic circuit formed in a semiconductor integrated circuit and responding to input signals having a first and second voltage level corresponding to a threshold level comprising a first transistor and a plurality of second transistors each having a collector base and emitter electrode, the collector electrodes of said second transistor group being connected in common; a connection means for supplying a power supply voltage across a first grounded conductor and a second conductor connected to a negative D.C. voltage supply; a first resistor means connected between the collector electrode of the first transistor and the first conductor and supplying a voltage ot said collector electrode; a second resistor means connected to the collector electrodes of the second transistor group and supplying a voltage to said collector electrodes; a constant current source consisting of a third transistor and a third resistor connected in series across the emitter electrodes of the first and second transistors and the second conductor; an output circuit containing a fourth and fifth transistor forming an emitter follower circuit to obtain output signals from the collector electrode of the first transistor as well as from those of the second transistor group, the base electrode of the fourth transistor being connected to the collector electrode of the first transistor, the collector electrode of said fourth transistor being connected to the first conductor and the emitter electrode of said fourth transistor being connected through a fourth resistor to the second conductor, and the base electrode of the fifth transistor being connected to the collector electrodes of the second transistor group, the collector electrode of said fifth transistor being connected to the first conductor and the emitter electrode of said fifth transistor being connected through a fifth resistor to the second conductor; a bias circuit supplying a threshold level of $-3/2\ V_{BE}$ to the base electrode of the first transistor and a bias voltage of $V_{EE}+2V_{BE}$ to the base electrode of the third transistor involved in the constant current source, the term $V_{BE}$ used herein representing the normal voltage across the base and emitter electrodes of the transistors used in the present invention and the term $V_{EE}$ denoting a negative D.C. voltage supply to the second conductor; an input circuit supplying the base electrodes of the second transistor group with a binary input signal having two voltage levels, namely $-V_{BE}$ as a first input signal and $-2V_{BE}$ as a second input signal; and an output circuit responding to the binary input signal, turning on either the first transistor or second transistor group thereby to issue a first and second output from the emitter electrodes of the fourth and fifth transistors, respectively.

3. A current switching logic circuit according to claim 2 wherein the bias circuit comprises serially connected sixth, seventh and eighth resistors and a plurality of first diodes jointly sharing the D.C. voltage impressed across the first and second conductors, the sixth resistor being connected to the first conductor, a second diode being connected parallel to the sixth and seventh resistors, the node of the sixth and seventh resistors being connected to the base electrode of a sixth transistor, the collector electrode of the sixth transistor being connected to the first conductor, the emitter electrode of the sixth transistors being connected through a ninth resistor to the second conductor, the emitter electrode of the sixth transistor supplying a threshold level of $-3/2\ V_{BE}$ to the base electrode of the first transistor, one end of the plurality of first diodes being connected to the second conductor, and the other end thereof being connected to the eighth resistor to supply a bias voltage of $V_{EE}+2V_{BE}$ to the base electrode of the third transistor involved in the constant current source, thereby to compensate for variations in the power supply voltage and temperature, the term $V_{BE}$ used herein denoting a normal voltage impressed across the base and emitter electrodes of the transistors used in the present invention and the term $V_{EE}$ representing a negative D.C. voltage supplied to the second conductor.

4. A current switching logic circuit according to claim 2 wherein the bias circuit comprises serially connected sixth, seventh and eighth resistors and a plurality of first diodes jointly sharing the D.C. voltage supplied across the first and second conductors, the sixth resistor being connected to the first conductor, a plurality of second diodes being connected parallel to the sixth and seventh resistors, the node of the sixth and seventh resistors being connected to the base electrode of the first transistor to supply a threshold level of $-3/2V_{BE}$ to said base electrode, one end of the plurality of first diodes being connected to the second conductor and the other end thereof being connected to the eighth resistor and also to the base electrode of the third transistor involved in the constant current source to supply a bias voltage of $V_{EE}+2V_{BE}$ to said base electrode, thereby to compensate for variations in the power supply voltage and temperature, the term $V_{BE}$ used herein denoting a normal voltage across the base and emitter electrodes of the transistors used in the present invention and the term $V_{EE}$ representing a negative D.C. voltage supplied to the second conductor.

5. A current switching logic circuit according to claim 2 wherein the bias circuit comprises serially connected sixth, seventh and eighth resistors and a plurality of first diodes jointly sharing the D.C. voltage impressed across the first and second conductors, the sixth resistor being connected to the first conductor, a second diode being connected parallel to the sixth and seventh resistors, the node of the sixth and seventh resistors being connected to the base electrode of a sixth transistor, the collector electrode of the sixth transistor being connected to the first conductor, the emitter electrode of the sixth transistor being connected to the collector electrode of a seventh transistor, the emitter electrode of the seventh transistor being connected to the second conductor, the base electrode of the seventh transistor being connected to the node of the eighth resistor and the plurality of first diode, the other end of the plurality of first diodes being connected to the second conductor, the emitter electrode of the sixth transistor being connected to the base electrode of the first transistor to supply a threshold level of $-3/2V_{BE}$ to said base electrode, the emitter electrode of the seventh transistor being connected to the base electrode of the third transistor to supply a bias voltage of $V_{EE}+2V_{BE}$ to said base electrode, thereby to compensate for variations in the power supply voltage and temperature, the term $V_{BE}$ used herein denoting a normal voltage impressed across the base and emitter electrodes of the transistors used in the present invention and the term $V_{EE}$ representing a negative D.C. voltage supplied to the second conductor.

6. A current switching logic circuit according to claim 2 wherein the first, second and third resistors are set at an equal value of resistance.

7. A current switching logic circuit formed in a semiconductor integrated circuit and responding to input signals having a first and second voltage level correspondingly to a threshold level comprising a first and second transistor and a plurality of third transistors each having a collector, base and emitter electrode, the emitter electrodes of the third transistor group being connected to the base electrode of the second transistor and through an emitter resistor to a first conductor; a connection means for supplying a power supply voltage across a first grounded conductor and a second conductor connected to a negative D.C. voltage supply; a connection means for connecting the collector electrodes of the third transistor group to the first conductor thereby to supply a potential to said third transistor group; a resistor means for connecting the collector electrode of the first transistor through a first resistor to the first conductor thereby to supply a potential to said first transistor; a resistor means for connecting the collector electrode of the second transistor through a second resistor to the first conductor thereby to supply a potential to said second transistor; a constant current source consisting of a fourth transistor and a third resistor connected in series between the emitter electrodes of the first and second transistors and the second conductor; an output circuit comprising a fifth and sixth transistor forming an emitter follower circuit to obtain output signals from the collector electrodes of the first and second transistors, the base electrode of the fifth transistor being connected to the collector electrode of the first transistor, the collector electrode of the fifth transistor being connected to the first conductor and the emitter electrode of the fifth transistor being connected through a fourth resistor to the second conductor, and the base electrode of the sixth transistor being connected to the collector electrode of the second transistor, the collector electrode of the sixth transistor being connected to the first conductor and the emitter electrode of the sixth transistor being connected through a fifth resistor to the second conductor; a bias circuit supplying a threshold level of $-5/2V_{BE}$ to the base electrode of the first transistor and a bias voltage of $V_{EE}+2V_{BE}$ to the base electrode of the fourth transistor, the term $V_{BE}$ used herein denoting a normal voltage impressed across the base and emitter electrodes of the transistors used in the present invention and the term $V_{BE}$ representing a negative D.C. voltage supplied to the second conductor; an input circuit supplying the base electrodes of the third transistor group with a binary input signal comprising a first input signal of $-V_{BE}$ and a second input signal of $-2V_{BE}$; and an output circuit responding to the binary input signal and turning on either the first or second transistor thereby to issue a first and second output from the emitter electrodes of the fifth and sixth transistors respectively.

8. A current switching logic circuit according to claim 7 wherein the bias circuit comprises a first diode, sixth, seventh and eighth resistors and a plurality of seconds diodes all connected in series and jointly sharing a D.C. voltage impressed across the first and second conductors, the first diode being connected between the first conductor and the sixth resistor, a third diode being connected parallel to the sixth and seventh resistors, the node of the sixth and seventh resistors being connected to the base electrode of the seventh transistor, the collector electrode of the seventh transistor being connected to the first conductor and the emitter electrode of the seventh transistor being connected through a ninth resistor to the second conductor and also to the base electrode of the first transistor to supply a threshold level of $-5/2V_{BE}$ to said base electrode, one end of the second diode being connected to the second conductor and the other end thereof being connected to an eighth resistor and also to the base electrode of a fourth transistor involved in the constant current source to supply a bias potential of $V_{EE}+2V_{BE}$ to said base electrode, thereby to compensate for variations in the power supply voltage and temperature, the term $V_{BE}$ used herein denoting a normal voltage impressed across the base and emitter electrodes of the transistors used in the present invention and the term $V_{EE}$ representing a negative D.C. voltage supplied to the second conductor.

9. A current switching logic circuit according to claim 7 wherein the bias circuit comprises a plurality of first diodes, sixth, seventh and eighth resistors and a plurality of second diodes all connected in series and jointly sharing the D.C. voltage impressed across the first and second conductors, the first diode group being connected between the first conductor and the sixth resistor, a third diode being connected parallel to the sixth and seventh resistors, the node of the sixth and seventh resistors being connected to the base electrode of the first transistor to supply a threshold level of $-3/2V_{BE}$ to said base electrode, one end of each second diode being connected to the second conductor and the other end thereof being connected to the eighth resistor and also to the base electrode of a fourth transistor involved in the constant current source to supply a bias potential of $V_{EE}+2V_{BE}$ to said base electrode, thereby to compensate for variations in the power supply voltage and temperature, the term $V_{BE}$ used herein denoting a normal voltage impressed across the base and emitter electrodes of the transistors used in the present invention and the term $V_{EE}$ representing a negative D.C. voltage supplied to the second conductor.

10. A current switching logic circuit according to claim 9 wherein the first, second and third resistors are set at an equal value of resistance.

References Cited

UNITED STATES PATENTS

| | | | |
|---|---|---|---|
| 3,054,910 | 9/1962 | Bothwell | 307—235 |
| 3,106,646 | 10/1963 | Carter | 307—254 |
| 3,259,761 | 7/1966 | Narud et al. | 307—215 |
| 3,329,835 | 7/1967 | D'Agostino | 307—215 |

DONALD D. FORRER, Primary Examiner

H. A. DIXON, Assistant Examiner

U.S. Cl. X.R.

307—270, 303